US012590229B2

(12) United States Patent
Kim et al.

(10) Patent No.: US 12,590,229 B2
(45) Date of Patent: Mar. 31, 2026

(54) POLYURETHANE-BASED ADHESIVE COMPOSITION, SURFACE PROTECTION FILM COMPRISING SAME, METHOD FOR MANUFACTURING SURFACE PROTECTION FILM, AND METHOD FOR MANUFACTURING ORGANIC LIGHT-EMITTING ELECTRONIC DEVICE

(71) Applicant: LG CHEM, LTD., Seoul (KR)

(72) Inventors: Jinhoo Kim, Daejeon (KR); Sang Hwan Kim, Daejeon (KR); Kwang Su Seo, Daejeon (KR)

(73) Assignee: Xinmei Fontana Holding (Hong Kong) Limited, Hong Kong (CN)

( * ) Notice: Subject to any disclaimer, the term of this patent is extended or adjusted under 35 U.S.C. 154(b) by 647 days.

(21) Appl. No.: 17/916,917

(22) PCT Filed: Sep. 7, 2021

(86) PCT No.: PCT/KR2021/012095
§ 371 (c)(1),
(2) Date: Oct. 4, 2022

(87) PCT Pub. No.: WO2022/050808
PCT Pub. Date: Mar. 10, 2022

(65) Prior Publication Data
US 2023/0151249 A1     May 18, 2023

(30) Foreign Application Priority Data
Sep. 7, 2020     (KR) ........................ 10-2020-0113642

(51) Int. Cl.
| | |
|---|---|
| *C09J 7/38* | (2018.01) |
| *C08G 18/48* | (2006.01) |
| *C08G 18/75* | (2006.01) |
| *C09J 5/00* | (2006.01) |
| *H10K 59/12* | (2023.01) |
| *H10K 59/40* | (2023.01) |
| *H10K 59/80* | (2023.01) |

(52) U.S. Cl.
CPC ............ *C09J 7/38* (2018.01); *C08G 18/4816* (2013.01); *C08G 18/4825* (2013.01); *C08G 18/4829* (2013.01); *C08G 18/4833* (2013.01); *C08G 18/758* (2013.01); *C09J 5/00* (2013.01); *H10K 59/1201* (2023.02); *H10K 59/40* (2023.02); *H10K 59/873* (2023.02); *C09J*

*2203/326* (2013.01); *C09J 2475/00* (2013.01); *Y10T 428/2896* (2015.01)

(58) Field of Classification Search
None
See application file for complete search history.

(56) References Cited

U.S. PATENT DOCUMENTS

| | | | |
|---|---|---|---|
| 8,957,156 B2 | 2/2015 | Kim et al. | |
| 10,190,029 B2 | 1/2019 | Franken et al. | |
| 2003/0178124 A1 | 9/2003 | Mikami et al. | |
| 2010/0032082 A1* | 2/2010 | Ho ............................ | C09J 7/29 |
| | | | 156/222 |
| 2011/0265932 A1* | 11/2011 | Jialanella ............... | C08G 18/12 |
| | | | 156/60 |
| 2014/0037949 A1 | 2/2014 | Jo et al. | |
| 2020/0343479 A1 | 10/2020 | Choi et al. | |
| 2022/0013747 A1 | 1/2022 | Choi et al. | |
| 2022/0089922 A1 | 3/2022 | Narutaki et al. | |

FOREIGN PATENT DOCUMENTS

| | | |
|---|---|---|
| CN | 111247657 | 6/2020 |
| JP | 2006-299283 A | 11/2006 |
| JP | 2016-186062 A | 10/2016 |
| JP | 2017-526764 A | 9/2017 |
| JP | 2018-062628 A | 4/2018 |
| JP | 2018-131629 A | 8/2018 |
| JP | 6705530 B2 | 6/2020 |
| KR | 10-2014-0016835 A | 2/2014 |
| KR | 10-1411014 B1 | 6/2014 |
| KR | 10-2018-0086131 A | 7/2018 |
| KR | 10-2019-0071604 A | 6/2019 |
| KR | 10-2020-0015191 A | 2/2020 |
| KR | 10-2020-0068293 A | 6/2020 |
| WO | 2015-098270 A | 7/2015 |
| WO | 2020121993 | 6/2020 |
| WO | 2020-153754 A | 7/2020 |

OTHER PUBLICATIONS

Translation of KR 10-2018-0086131 A (Year: 2018).*
Machine translation of JP2018062628 A, Apr. 19, 2018 (Year: 2018).*

* cited by examiner

*Primary Examiner* — Anish P Desai
(74) *Attorney, Agent, or Firm* — Ricky Lam

(57) ABSTRACT

The present specification relates to a polyurethane-based adhesive composition, a surface protective film comprising the same, a method for preparing a surface protective film, and a method for manufacturing an organic light emitting electronic device.

8 Claims, 1 Drawing Sheet

【FIG. 1】
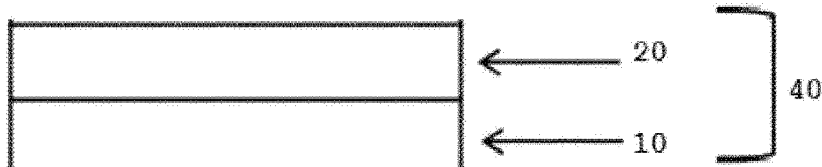
【FIG. 2】
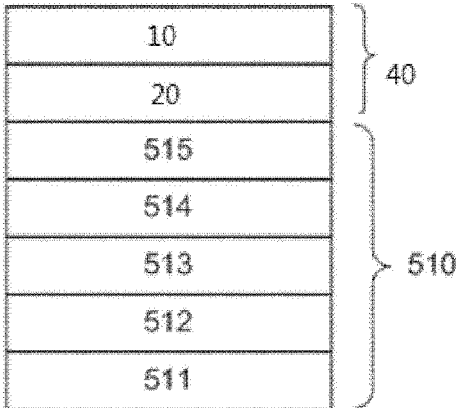

POLYURETHANE-BASED ADHESIVE COMPOSITION, SURFACE PROTECTION FILM COMPRISING SAME, METHOD FOR MANUFACTURING SURFACE PROTECTION FILM, AND METHOD FOR MANUFACTURING ORGANIC LIGHT-EMITTING ELECTRONIC DEVICE

The present application is a National Phase entry pursuant to 35 U.S.C. § 371 of International Application No. PCT/KR2021/012095 filed on Sep. 7, 2021, and claims priority to and the benefit of Korean Patent Application No. 10-2020-0113642, filed with the Korean Intellectual Property Office on Sep. 7, 2020, the entire contents of which are incorporated herein by reference.

FIELD

The present application relates to a polyurethane-based adhesive composition, a surface protective film comprising the same, a method for preparing a surface protective film, and a method for manufacturing an organic light emitting electronic device.

BACKGROUND

With recent development in display-related technologies, display devices transformable at the stage of use such as folding, rolling into a roll shape or stretching like a rubber band have been researched and developed. These displays may be transformed into various shapes, and therefore, may satisfy demands for both a larger display at the stage of use and a smaller display for portability.

In addition, portable terminals such as mobile communication terminals (wireless terminal), personal digital assistants (PDA), portable multimedia players (PMP) and electronic notebooks tend to be smaller in size for portability.

However, users want to receive information in various formats such as textual information, videos and games through a screen of a portable terminal, and therefore require an enlarged or widened screen regarding the size of a display screen. However, satisfying both requirements has limits since a smaller portable terminal leads to a reduction in the size of a display screen.

Existing display devices have used non-transformable displays (unbreakable display), however, in order to overcome such limits, transformable displays, that is, flexible displays such as curved displays, bent displays, foldable displays and rollable displays have been developed.

A plastic substrate used as a substrate material of a flexible display has a problem of significantly low gas barrier properties (moisture, oxygen and the like). In view of this, a barrier film employing various materials and structures have been formed on the substrate in the art in order to improve problems of the plastic substrate.

However, as existing barrier films are not used any more recently, development of a surface protective film for a process capable of protecting a thin film encapsulation (TFE) layer during a manufacturing process of a flexible optical device has been required. A surface protective film for a process is a film temporarily protecting a thin film encapsulation layer, and is attached to the thin film encapsulation layer during the process to prevent contamination or damage on the thin film encapsulation layer surface during the process, and is removed when the process is finished.

Properties required for the surface protective film are that, first, an adhesive provided on the surface protective film needs to be well-attached on an adherend surface and needs to prevent damage to the adherend by being removable with low peel strength. Second, adherend contamination needs to be avoided by having little adhesive residue remaining after removing the surface protective film.

Adhesives used in a surface protective film generally comprise acryl-based adhesives, silicone-based adhesives, urethane-based adhesives, and the like. Acryl-based adhesives have excellent adhesive strength, but have poor re-peelability after adhesion, which may cause a problem of damaging an adherend or leaving residue on an adherend. Silicone-based adhesives readily cause adherend contamination although low-rate and high-rate peel strength are all superior after adhering to an adherend.

Accordingly, development of a novel adhesive composition and a protective film comprising the same has been required in order to resolve such problems.

Patent Documents

Japanese Patent Application Laid-Open Publication No. 2006-299283

SUMMARY

The present application is directed to providing a polyurethane-based adhesive composition, a surface protective film comprising the same, and a method for preparing a surface protective film.

One embodiment of the present application provides a polyurethane-based adhesive composition comprising a polyurethane polymer comprising a difunctional polyol and a trifunctional polyol; and an isocyanate-based crosslinking agent, wherein the adhesive composition has viscosity of greater than or equal to 1,000 cPs and less than or equal to 10,000 cPs under a condition of 25° C. and relative humidity of 60%, the difunctional polyol is included in 5 parts by weight to 40 parts by weight based on 100 parts by weight of the polyurethane polymer, and the trifunctional polyol is included in 60 parts by weight to 95 parts by weight based on 100 parts by weight of the polyurethane polymer.

Another embodiment of the present application provides a surface protective film comprising a base film; and an adhesive film comprising the polyurethane-based adhesive composition according to the present application or a cured material thereof provided on one surface of the base film.

Another embodiment of the present application provides a method for preparing a surface protective film, the method comprising preparing the polyurethane-based adhesive composition according to the present application; adding a curing agent to the polyurethane-based adhesive composition; and coating the polyurethane-based adhesive composition on a base film.

Lastly, one embodiment of the present application provides a method for manufacturing an organic light emitting electronic device, the method comprising attaching the adhesive film of the surface protective film according to the present application on an encapsulation layer of an organic light emitting device.

In a polyurethane-based adhesive composition according to one embodiment of the present application, the content of the difunctional polyol and the trifunctional polyol satisfies a specific range, and urethane crosslinking density can be effectively controlled by controlling a hydroxyl group of the urethane polyol.

In addition, when viscosity of the adhesive composition satisfies a specific range, excellent coatability with a small thickness variation for a base can be obtained during coating. An adhesive film comprising the same has favorable adhesion to an adherend, has excellent adhesive strength, and also has excellent re-peelability at a high rate while having favorable re-peelability at a low rate. Accordingly, the adherend can be protected due to superior adhesive strength with the adherend during the process, and adherend contamination can be prevented as well due to less adhesive film residue when removed.

In addition, a surface protective film according to one embodiment of the present application has a small amount of adhesive film residue on an adherend surface even when removing the surface protective film from the adherend, and damage or contamination on the adherend surface can be prevented after removing the surface protective film.

In addition, the surface protective film of the present disclosure maintains adhesive strength with an adherend even at high temperature, and delamination of the surface protective film from the adherend at a high temperature can be prevented.

BRIEF DESCRIPTION OF THE DRAWINGS

FIG. 1 is a diagram illustrating a side view of a surface protective film according to one embodiment of the present application.

FIG. 2 illustrates one embodiment in which the surface protective film according to one embodiment of the present disclosure is attached to an organic light emitting device (510).

DETAILED DESCRIPTION

Hereinafter, the present specification will be described in more detail.

Before describing the present disclosure, several terms will be defined first.

In the present specification, a description of a certain part as "including" certain constituents means capable of further comprising other constituents, and does not exclude other constituents unless particularly stated on the contrary.

In the present specification, 'p to q' means a range of 'greater than or equal to p and less than or equal to q'.

In the present specification, a (meth)acrylate comprises both an acrylate and a methacrylate.

In the present specification, a polymer comprising a certain monomer as a monomer unit means the monomer participating in a polymerization reaction and being included in the polymer as a repeating unit. In the present specification, a polymer comprising a monomer is interpreted in the same manner as the polymer comprising the monomer as a monomer unit.

In the present specification, it is understood that a 'polymer' is used in a broad sense comprising a copolymer unless specified as a 'homopolymer'.

In the present specification, a "monomer unit" means that the corresponding compound is polymerized to form bonds in a polymer.

In the present specification, a weight average molecular weight (Mw) and a number average molecular weight (Mn) are polystyrene converted molecular weights employing a monodispersed polystyrene polymer (standard sample) having various degrees of polymerization commercially available for measuring a molecular weight as a standard material, and measured by gel permeation chromatography (GPC). In the present specification, a molecular weight means a weight average molecular weight unless particularly described otherwise.

The weight average molecular weight is one of average molecular weights not uniform in the molecular weights and using a molecular weight of a certain polymer material as a standard, and is a value obtained by averaging molecular weights of component molecular species of a polymer compound having molecular weight distribution by a weight fraction.

The weight average molecular weight may be measured through a gel permeation chromatography (GPC) analysis.

Hereinafter, embodiments of the present disclosure will be described in detail with reference to accompanying drawings so that those skilled in the art may readily implement the present disclosure. However, the present disclosure may be embodied in various different forms, and is not limited to the embodiments described herein.

One embodiment of the present application provides a polyurethane-based adhesive composition comprising a polyurethane polymer comprising a difunctional polyol and a trifunctional polyol; and an isocyanate-based crosslinking agent, wherein the adhesive composition has viscosity of greater than or equal to 1,000 cPs and less than or equal to 10,000 cPs under a condition of 25° C. and relative humidity of 60%, the difunctional polyol is included in 5 parts by weight to 40 parts by weight based on 100 parts by weight of the polyurethane polymer, and the trifunctional polyol is included in 60 parts by weight to 95 parts by weight based on 100 parts by weight of the polyurethane polymer.

In the polyurethane-based adhesive composition according to one embodiment of the present application, the content of the difunctional polyol and the trifunctional polyol satisfy a specific range, and the urethane crosslinking density may be effectively controlled by controlling a hydroxyl group of the urethane polyol.

In addition, the viscosity of the adhesive composition satisfies a specific range, thus excellent coatability with a small thickness variation for a base may be obtained during coating. An adhesive film comprising the same has favorable adhesion to an adherend, has excellent adhesive strength, and also has excellent re-peelability at a high rate while having favorable re-peelability at a low rate. Accordingly, the adherend may be protected due to superior adhesive strength with the adherend during the process, and adherend contamination may be prevented as well due to less adhesive film residue when removed.

In one embodiment of the present application, the difunctional polyol and the trifunctional polyol are particularly preferably an ether polyol.

In one embodiment of the present application, the difunctional polyol may be included in 5 parts by weight to 40 parts by weight based on 100 parts by weight of the polyurethane polymer, and the trifunctional polyol may be included in 60 parts by weight to 95 parts by weight based on 100 parts by weight of the polyurethane polymer.

In one embodiment of the present application, the difunctional polyol may be included in 5 parts by weight to 40 parts by weight, preferably in 7 parts by weight to 35 parts by weight, and more preferably in 10 parts by weight to 30 parts by weight, based on 100 parts by weight of the polyurethane polymer.

In one embodiment of the present application, the trifunctional polyol may be included in 60 parts by weight to 95 parts by weight, preferably in 60 parts by weight to 90 parts by weight, and more preferably in 70 parts by weight to 90 parts by weight, based on 100 parts by weight of the polyurethane polymer.

The polyurethane-based adhesive composition according to the present application has a polyurethane polymer, and particularly, the difunctional polyol and the trifunctional polyol in the polyurethane polymer satisfy the above-mentioned weight ranges. Particularly, when the difunctional polyol satisfies the above-mentioned weight range, suitable peel strength is obtained since adhesion and flexibility are provided to two-dimensional crosslinking and an adherend, and the crosslinking distance is suitable. When the trifunctional polyol satisfies the above-mentioned weight range, re-peel strength is reduced by increasing the degree of three-dimensional crosslinking, and gelation of the adhesive composition comprising the same may be prevented by adjusting the molecular weight range to a specific range.

In the polyurethane-based adhesive composition provided in one embodiment of the present application, the hydroxyl group of the polyurethane polymer and the isocyanate functional group have a molar ratio (—OH/NCO) of greater than or equal to 1.3 and less than or equal to 1.7.

In another embodiment, the hydroxyl group of the polyurethane polymer and the isocyanate functional group have a molar ratio (—OH/NCO) of greater than or equal to 1.3 and less than or equal to 1.7, preferably greater than or equal to 1.35 and less than or equal to 1.7, and more preferably greater than or equal to 1.4 and less than or equal to 1.65.

In the present application, the functional group is also expressed as a functional atomic group, and may mean, in a group of organic compounds having common chemical properties, a common atomic group or bonding mode causing the properties.

In other words, in the present application, an expression such as difunctional or trifunctional may mean the number of functional groups having common chemical properties in a specific molecule, and specifically, difunctional means comprising two functional groups and trifunctional means comprising three functional groups.

In the present application, the polyol is, as a material obtained by reacting an initiator such as a multifunctional alcohol or aromatic amine having two or more hydroxyl groups (—OH) or amine groups (—NH$_2$) in the molecule with propylene oxide (PO) or ethylene oxide (EO) under a specific condition, a material preparing a polyurethane polymer together with an isocyanate, and the polyol may mean a material having two functional groups or three functional groups by reacting PPG (propylene glycol), PTMEG (tetramethylene glycol) or PEG (ethylene glycol) polyester with propylene oxide (PO) or ethylene oxide (EO).

In the present application, by the functional group ratio of the polyurethane polymer satisfying the above-mentioned range, gelation of the adhesive composition may be prevented and molecular weight and viscosity ranges may be properly adjusted, and as a result, properties suitable for an adhesive composition coating are obtained. In other words, in one embodiment of the present application, the functional group ratio of the polyurethane polymer is adjusted to have proper molecular weight and viscosity, and the adjustment factor is dependent on content and type of the solvent or the crosslinking agent included in the adhesive composition.

In one embodiment of the present application, the adhesive composition may have viscosity of greater than or equal to 1,000 cPs and less than or equal to 10,000 cPs under a condition of 25° C. and relative humidity of 60%.

In the present application, viscosity is a quantitative expression indicating the magnitude of difficulty in the flow of a fluid, that is, a degree of stickiness, and when a fluid is flowing, shear force per unit area acting between adjacent fluid layers is proportional to the velocity gradient at the position, and this proportional constant is referred to as viscosity. In other words, in the present application, viscosity is internal resistance when a fluid flows, and a method of expressing viscosity comprises kinematic viscosity, absolute viscosity and the like.

In one embodiment of the present application, the viscosity may be measured with low viscosity to high viscosity liquid samples at a constant temperature using a HB-type rotational or vibrational viscometer manufactured by Brookfield Ametek.

Specifically, the viscosity may be measured using a Brookfield HB viscometer at a temperature of 25° C. using No. 40 and No. 52 spindles provided by Brookfield, and when measuring the viscosity, the rotational rate may be adjusted so that the torque value, a force applied to the composition, comes between 20% to 60%.

In one embodiment of the present application, the viscosity of the adhesive composition may satisfy a range of greater than or equal to 1,000 cPs and less than or equal to 10,000 cPs, preferably greater than or equal to 1,500 cPs and less than or equal to 8,000 cPs, and more preferably greater than or equal to 2,000 cPs and less than or equal to 7,000 cPs, under a condition of 25° C. and relative humidity of 60%.

In the present application, when the viscosity of the adhesive composition is outside the above-mentioned lower limit, the adhesive composition flows due to low viscosity when coating, making coating difficult. When the viscosity is outside the above-mentioned upper limit, introducing the coating solution using a pump is difficult in mass production, thus lowering productivity of producing the adhesive film.

In one embodiment of the present application, the viscosity basically increases when the molecular weight increases, and the value increases as the ratio of the trifunctional polyol included in the adhesive composition increases, and accordingly, a main purpose of the present disclosure is attaining the viscosity range as above, and a molecular weight range to be described later, by the difunctional polyol and the trifunctional polyol in the polyurethane polymer satisfying the above-mentioned specific weight ranges, and the functional group ratio (—OH/NCO) satisfying the specific range in the polyurethane-based adhesive composition according to the present application.

In the adhesive composition provided in one embodiment of the present application, the polyurethane polymer comprises a solvent, and the solvent is included in greater than or equal to 5 parts by weight and less than or equal to 35 parts by weight, based on 100 parts by weight of a sum of the difunctional polyol and the trifunctional polyol.

As the solvent included in the polyurethane polymer, toluene, methyl ethyl ketone (MEK), methyl isobutyl ketone (MIBK) or ethyl acetate (EAc) may be used, however, the solvent is not limited thereto as long as it is capable of dissolving specific materials, and resulting general organic solvents may be used.

In another embodiment, the polyurethane polymer comprises a solvent, and the solvent may be included in greater than or equal to 5 parts by weight and less than or equal to 35 parts by weight, preferably greater than or equal to 7 parts by weight and less than or equal to 35 parts by weight, and more preferably greater than or equal to 10 parts by weight and less than or equal to 30 parts by weight, based on 100 parts by weight of a sum of the difunctional polyol and the trifunctional polyol.

The ratio of the functional groups of the polyurethane polymer is adjusted to have proper molecular weight and viscosity, and the adjustment factor is dependent on content and type of the solvent or the crosslinking agent included in the adhesive composition. Particularly, in preparing the polyurethane polymer as above, the viscosity of the adhesive composition itself is adjusted to a specific range by adjusting the solvent content range, and as a result, properties of excellent productivity and preventing gelation are obtained.

In one embodiment of the present application, a non-volatile content of the polyurethane polymer may satisfy a range of greater than or equal to 65% and less than or equal to 95%.

In another embodiment, the non-volatile content of the polyurethane polymer may be greater than or equal to 65% and less than or equal to 95%, greater than or equal to 70% and less than or equal to 95%, or greater than or equal to 75% and less than or equal to 90%.

In the adhesive composition provided in one embodiment of the present application, the polyurethane polymer has a molecular weight of greater than or equal to 50,000 g/mol and less than or equal to 200,000 g/mol.

In another embodiment, the molecular weight of the polyurethane polymer may satisfy a range of greater than or equal to 50,000 g/mol and less than or equal to 200,000 g/mol, preferably greater than or equal to 60,000 g/mol and less than or equal to 180,000 g/mol, and more preferably greater than or equal to 80,000 g/mol and less than or equal to 150,000 g/mol.

By providing the molecular weight of the polyurethane polymer within the above-mentioned range, the viscosity of the adhesive composition comprising the same satisfies a specific range, and as a result, properties of excellent productivity and preventing gelation are obtained.

In other words, by the content portion of the difunctional polyol and the trifunctional polyol satisfying a specific range and the viscosity of the adhesive composition satisfying a specific range as well in the polyurethane-based adhesive composition according to the present application, an adhesive film comprising the same has favorable adhesion to an adherend, has excellent adhesive strength, and also has excellent re-peelability at a high rate while having favorable re-peelability at a low rate. In addition, the adherend may be protected due to superior adhesive strength with the adherend during the process, and, while preventing adherend contamination due to less adhesive film residue when removed, excellent productivity is obtained in terms of production of the polyurethane polymer by preventing gelation and thereby having excellent coatability.

In one embodiment of the present application, the polyurethane-based adhesive composition may have a glass transition temperature (Tg) value of 0° C. or lower, and −60° C. or higher and preferably −50° C. or higher.

In one embodiment of the present application, the glass transition temperature of the polyurethane-based adhesive composition may satisfy the above-mentioned range by adjusting a molar ratio (content ratio) of the polyurethane polymer and the isocyanate-based crosslinking agent included in the adhesive composition.

By the glass transition temperature of the adhesive composition according to the present application satisfying the above-mentioned range, an adhesive film comprising the same has particularly excellent folding properties. In other words, by adjusting a molar ratio (content ratio) of the polyurethane polymer and the isocyanate-based crosslinking agent included in the adhesive composition to a specific range in the adhesive composition, the glass transition temperature of the whole adhesive composition may be adjusted to a range of 0° C. or lower, and accordingly, an adhesive film having superior folding and bending properties may be formed.

In the present specification, the glass transition temperature is a value obtained by, using a differential scanning calorimeter (DSC, Mettler Toledo), sealing approximately 10 mg of a sample in a dedicated pan, heating the sample under a constant temperature raising environment, and drawing endothermic and exothermic amounts of materials resulting from a phase change depending on a temperature.

Specifically, the glass transition temperature is a nominal value described in the literature, catalogues and the like, or a value calculated based on the following General Formula (1) (Fox formula).

$$1/Tg = W1/Tg1 + W2/Tg2 + \ldots + Wn/Tgn \qquad \text{[General Formula (1)]}$$

In General Formula (1), Tg represents a glass transition temperature (unit: K) of Polymer A, Tgi (i=1, 2, . . . n) represents a glass transition temperature (unit: K) when Monomer i forms a homopolymer, and Wi (i=1, 2, . . . n) represents a mass fraction in all monomer components of Monomer i.

General Formula (1) means a calculation formula when Polymer A comprises n types of monomer components of Monomer 1, Monomer 2, . . . , Monomer n.

General Formula (1) is a case of an acrylic resin based on an acrylic monomer, however, measurements may be conducted in a similar manner as a glass transition temperature or the like of a polymer known as an urethane resin as in the disclosure of the present application.

In one embodiment of the present application, as for the glass transition temperature of the adhesive composition, a content of each monomer may be estimated through a component analysis, and the glass transition temperature may be calculated therefrom based on General Formula (1) (Fox formula).

In the adhesive composition provided in one embodiment of the present application, the polyurethane-based adhesive composition further comprises one or more selected from the group consisting of a solvent, a curing agent, a dispersant, a photoinitiator, a thermal initiator, a silane coupling agent, a plasticizer, a tackifier and an antistatic agent.

In one embodiment of the present application, the crosslinking agent may comprise a crosslinking compound, and as the crosslinking agent, an isocyanate-based crosslinking agent may be used, and those known in the art may be used.

As the isocyanate crosslinking agent, any suitable multifunctional isocyanate compound commonly used in the art may be selected and used as long as it is a compound usable in a urethanization reaction.

Examples of the multifunctional isocyanate compound may comprise a multifunctional aliphatic-based isocyanate, a multifunctional alicyclic-based isocyanate, a multifunctional aromatic-based isocyanate compound, a trimethylol propane adduct obtained by modifying polyisocyanate with a trifunctional isocyanate, a biuret body obtained by reacting polyisocyanate with water, a trimer having an isocyanurate ring and the like, but are not limited thereto.

Examples of the multifunctional aliphatic-based isocyanate compound may comprise trimethylene diisocyanate, tetramethylene diisocyanate, pentamethylene diisocyanate, hexamethylene diisocyanate, 1,2-propylene diisocyanate, 1,3-butylene diisocyanate, dodecamethylene diisocyanate, 2,4,4-trimethylhexamethylene diisocyanate and the like, but are not limited thereto.

Examples of the multifunctional alicyclic-based isocyanate compound may comprise isophorone diisocyanate (IPDI), 1,4-cyclohexane diisocyanate (CHDI), 4,4'-dicyclohexylmethane diisocyanate (HMDI), bis(isocyanatomethyl) cyclohexane (HXDI) and the like, but are not limited thereto.

Examples of the multifunctional aromatic-based isocyanate compound may comprise toluene 2,4-diisocyanate (TDI), toluene 2,6-diisocyanate (TDI), 4,4'-methylene diphenyl diisocyanate (MDI), 2,4'-methylene diphenyl diisocyanate (MDI), polymeric methylene diphenyl diisocyanate (PMDI), p-phenylene diisocyanate (PDI), m-phenylene diisocyanate (PDI), naphthalene 1,5-diisocyanate (NDI), naphthalene 2,4-diisocyanate (NDI), p-xylylene diisocyanate (XDI), 1,3-bis(1-isocyanato-1-methylethyl)benzene (TMXDI) and the like, but are not limited thereto.

In one embodiment of the present specification, two or more types of the isocyanate compound may be mixed to the adhesive composition, and herein, type and content of the two or more types of the isocyanate compound may be properly selected. For example, as the isocyanate compound included in the adhesive composition, the multifunctional aromatic-based isocyanate compound and the multifunctional aliphatic-based isocyanate compound may be mixed and used.

As the antistatic agent, known material may be used to accomplish target effects, and considering purposes of the present application, a suitable antistatic composition may be used. For example, the antistatic agent may comprise one selected from the group consisting of acryl-based resins, urethane-based resins, urethane-acryl-based copolymers, ester-based resins, ether-based resins, amide-based resins, epoxy-based resins and melamine resins, or a mixture thereof, but is not limited thereto.

In one example, the antistatic composition may comprise a conductive material. The conductive material may comprise a conductive polymer or carbon nanotubes, but is not limited thereto.

The conductive polymer may comprise, for example, polyaniline-based, polypyrrole-based, polythiophene-based, a derivative or copolymer thereof, but is not limited thereto.

The carbon nanotubes may have a tube shape produced by rolling a graphite plate shape formed by connecting hexagonal rings formed with 6 carbon atoms to each other. Carbon nanotubes have excellent rigidity and electrical conductivity, and when included in the antistatic composition of the surface protective film, hardness may increase, and an antistatic function may be enhanced.

In addition, as the thermal initiator, those known in the art may be used.

As the solvent, toluene, methyl ethyl ketone (MEK), methyl isobutyl ketone (MIBK) or ethyl acetate (EAc) may be used, however, the solvent is not limited thereto as long as it is capable of dissolving specific materials, and resulting general organic solvents may be used.

One embodiment of the present application provides a surface protective film comprising a base film; and an adhesive film comprising the polyurethane-based adhesive composition or a cured material thereof provided on one surface of the base film.

In the present application, the meaning of the adhesive film comprising the polyurethane-based adhesive composition may comprise the adhesive composition as-is.

In the present application, the meaning of the adhesive film comprising the polyurethane-based adhesive composition may comprise the adhesive composition after drying.

In the present application, the meaning of the adhesive film comprising the polyurethane-based adhesive composition may comprise the adhesive composition after thermal curing.

In the present application, the meaning of the adhesive film comprising the polyurethane-based adhesive composition may comprise the adhesive composition after photocuring.

In the surface protective film provided in one embodiment of the present application, low-rate peel strength is 5 gf/inch or greater when bonding one surface of the adhesive film to a glass substrate and then peeling at a peeling angle of 180° and a rate of 1.8 m/min, and high-rate peel strength is 50 gf/inch or less when bonding one surface of the adhesive film to a glass substrate and peeling at a peeling angle of 180° and a rate of 20 m/min.

In the present application, the adhesive film comprising the polyurethane-based adhesive composition has excellent re-peel strength at a high rate as well as having favorable re-peel strength at a low rate.

In another embodiment, low-rate peel strength may be 5 gf/inch or greater, preferably 5.5 gf/inch or greater and more preferably 6 gf/inch or greater when bonding one surface of the adhesive film to a glass substrate, and peeling at a peeling angle of 180° and a rate of 1.8 m/min.

In another embodiment, low-rate peel strength may be 60 gf/inch or less, preferably 55 gf/inch or less and more preferably 40 gf/inch or less when bonding one surface of the adhesive film to a glass substrate, and peeling at a peeling angle of 180° and a rate of 1.8 m/min.

In another embodiment, high-rate peel strength may be 50 gf/inch or less, preferably 48 gf/inch or less, and more preferably 45 gf/inch or less when bonding one surface of the adhesive film to a glass substrate, and peeling at a peeling angle of 180° and a rate of 20 m/min.

In another embodiment, high-rate peel strength may be 10 gf/inch or greater, preferably 20 gf/inch or greater and more preferably 35 gf/inch or greater when bonding one surface of the adhesive film to a glass substrate, and peeling at a peeling angle of 180° and a rate of 20 m/min.

By the high-rate peel strength and the low-rate peel strength satisfying the above-mentioned ranges, the adhesive film according to the present application has favorable adhesion to an adherend, has excellent adhesive strength, and also has excellent re-peelability at a high rate while having favorable re-peelability at a low rate. Accordingly, the adherend may be protected due to superior adhesive strength with the adherend during the process, and adherend contamination may be prevented as well due to less residue of the adhesive film when removed.

The low-rate peel strength means a value obtained when cutting the adhesive film according to the present disclosure to a width of 1 inch, attaching to a glass substrate by going back and forth once using a 2 kg rubber roller, leaving unattended for 10 minutes or less at 23° C., and while peeling the adhesive film at an angle of 180° and a peeling rate of 1.8 m/min using a texture analyzer (manufactured by Stable Micro Systems).

The high-rate peel strength means a value obtained when cutting the adhesive film according to the present disclosure to a width of 1 inch, attaching to a glass substrate by going back and forth once using a 2 kg rubber roller, leaving unattended for 10 minutes or less at 23° C., and while peeling the adhesive film at an angle of 180° and a peeling rate of 20 m/min using a texture analyzer (manufactured by Stable Micro Systems).

In one embodiment of the present application, the base film may be selected from the group consisting of PET (polyethylene terephthalate), PC (polycarbonate), PI (polyimide), PEN (polyethylene naphthalate), PEEK (polyether ether ketone), PAR (polyarylate), PCO (polycyclic olefin), polynorbornene, PES (polyethersulphone) and COP (cycloolefin polymer).

PET (polyethylene terephthalate), PEN (polyethylene naphthalate) and PAR (polyarylate) may be one type of polyester.

In another embodiment, the base film may be PET (polyethylene terephthalate).

In one embodiment of the present application, the base film may have a thickness of greater than or equal to 25 µm and less than or equal to 150 µm, preferably greater than or equal to 38 µm and less than or equal to 130 µm, and more preferably greater than or equal to 50 µm and less than or equal to 125 µm.

The base film referred to herein may be a transparent base film, and being transparent means having visible light (400 nm to 700 nm) transmittance of 80% or greater.

When the base film has a thickness in the above-mentioned range, the laminated protective film may be thin-filmed, and an adherend may be sufficiently protected from external impact when used in a process later.

In one embodiment of the present application, the adhesive film may have a thickness of greater than or equal to 10 µm and less than or equal to 100 µm.

In another embodiment, the adhesive film may have a thickness of greater than or equal to 10 µm and less than or equal to 100 µm, preferably greater than or equal to 12 µm and less than or equal to 75 µm, and more preferably greater than or equal to 15 µm and less than or equal to 50 µm.

When the adhesive film has a thickness in the above-mentioned range, the generation of air bubbles inside the adhesive film can be reduced, and accordingly, superior adhesive strength is obtained when adhering with an adherend, delamination does not occur, and denting does not occur.

In one embodiment of the present application, an antistatic layer may be included on a surface of the base film in contact with the adhesive film. In this case, the antistatic hard coating layer may be included on a surface of the base film opposite to the surface in contact with the adhesive film.

By the adhesive film according to one embodiment of the present disclosure being provided on one surface of the antistatic layer, the amount of accumulated static electricity may be reduced. In addition, since surface resistance of the adhesive film decreases, generation of static electricity on the adhesive film surface may be reduced when peeling the protective layer from the surface protective film.

Accordingly, when removing the protective layer from the surface protective film in order to attach the adhesive film to an adherend surface, or when peeling the surface protective film from an adherend surface, foreign substances that may be attached to the adhesive film or the adherend by static electricity may be prevented. In addition, deterioration in the properties of the adherend surface may be prevented by preventing contamination on the adherend surface during the process.

The term 'antistatic layer' in the present specification means a layer for the purpose of suppressing generation of static electricity.

The antistatic layer may be formed using known methods to achieve target effects. For example, the antistatic layer may be formed on one surface or both surfaces of the base layer using an inline coating method.

In the present disclosure, the antistatic layer may be formed using a proper antistatic composition considering purposes of the present application. For example, the first antistatic layer may comprise one selected from the group consisting of acryl-based resins, urethane-based resins, urethane-acryl-based copolymers, ester-based resins, ether-based resins, amide-based resins, epoxy-based resins and melamine resins, or a mixture thereof, but is not limited thereto.

In one example, the antistatic layer may comprise a conductive material. The conductive material may comprise a conductive polymer or carbon nanotubes, but is not limited thereto.

The conductive polymer may comprise, for example, polyaniline-based, polypyrrole-based, polythiophene-based, a derivative or copolymer thereof, but is not limited thereto.

The carbon nanotubes may have a tube shape produced by rounding a graphite plate shape formed by connecting hexagonal rings formed with 6 carbons to each other. The carbon nanotubes have excellent rigidity and electrical conductivity, and when used as the antistatic layer of the surface protective film, hardness of the antistatic layer increases, and an antistatic function may be enhanced.

A thickness of the antistatic layer may be properly selected considering purposes of the present application, and the antistatic layer may have a thickness of 10 nm or greater; or 20 nm or greater. In one embodiment, the antistatic layer may have a thickness of 400 nm or less; 300 nm or less; or 100 nm or less. By providing the antistatic layer with a thickness satisfying a range of greater than or equal to 10 nm and less than or equal to 400 nm, excellent coatability is obtained in the base film.

In one embodiment, surface resistance of the antistatic layer may be properly selected considering purposes of the present application. For example, surface resistance of the first antistatic layer may be each independently $10^4$ Ω/sq or greater; $10^5$ Ω/sq or greater; $10^6$ Ω/sq or greater; $10^7$ Ω/sq or greater; $10^8$ Ω/sq or greater; or $10^9$ Ω/sq or greater. For example, surface resistance of the antistatic layer may be each independently $5\times10^{12}$ Ω/sq or less; or $10^{11}$ Ω/sq or less. When the antistatic layer has surface resistance in the above-described range, the surface protective film may have an excellent antistatic function.

In the protective film provided in one embodiment of the present application, the surface protective film has a thickness of greater than or equal to 35 µm and less than or equal to 250 µm.

In another embodiment, the surface protective film may have a thickness of greater than or equal to 35 µm and less than or equal to 250 µm, preferably greater than or equal to 50 µm and less than or equal to 200 µm, and more preferably greater than or equal to 60 µm and less than or equal to 150 µm.

When the surface protective film has a thickness in the above-mentioned range, a suitable thickness is obtained when applied to an adherend later, adhesive strength is not reduced, and a surface protective film having excellent reliability even when repeating folding/unfolding several times may be provided.

In one embodiment of the present application, the adhesive film may be laminated in a plural number.

The surface protective film provided in one embodiment of the present application further comprises a release sheet on a surface of the adhesive film opposite to the surface in contact with the base film.

Including a release sheet on one surface of the adhesive film means providing a release sheet on a surface of the adhesive film opposite to the surface in contact with the base film.

In one embodiment of the present application, a hydrophobic film may be used as the release sheet. The release sheet is a layer for protecting a very thin adhesive sheet and refers to a transparent layer attached on one surface of the adhesive film, and films having excellent mechanical strength, thermal stability, moisture barrier properties, isotropy and the like may be used. For example, acetate-based materials such as triacetyl cellulose (TAC), polyester-based, polyethersulphone-based, polycarbonate-based, polyamide-based, polyimide-based, polyolefin-based, cycloolefin-based, polyurethane-based and acryl-based resin films, and the like, may be used, however, the release sheet is not limited thereto as long as it is a commercially available silicone-treated release sheet.

The release sheet is for protecting a surface for a process, and may all be removed when used.

One embodiment of the present application provides a method for preparing a surface protective film, the method comprising preparing the polyurethane-based adhesive composition according to the present application; adding a curing agent to the polyurethane-based adhesive composition; and coating the polyurethane-based adhesive composition on a base film.

In the method for preparing a surface protective film, descriptions on the polyurethane-based adhesive composition are the same as the descriptions provided above.

The method for preparing a surface protective film provided in one embodiment of the present application further comprises, after the coating of the polyurethane-based adhesive composition on a base film, drying the polyurethane-based adhesive composition; and thermal curing the polyurethane-based adhesive composition.

One embodiment of the present specification provides a method for manufacturing an organic light emitting electronic device.

In one embodiment of the present specification, the method for manufacturing an organic light emitting electronic device comprises attaching the adhesive film of the surface protective film described above on an encapsulation layer of an organic light emitting device.

In other words, the method for manufacturing an organic light emitting electronic device provided in the present specification comprises attaching, on a surface protective film comprising a base film; and an adhesive film comprising the polyurethane-based adhesive composition of the present application or a cured material thereof provided on one surface of the base film, the adhesive film of the protective film on an encapsulation layer of an organic light emitting device.

In one embodiment, when the surface protective film further comprises a protective layer, the method for manufacturing an organic light emitting electronic device further comprises removing the protective layer from the surface protective film prior to the attaching of the adhesive layer on an encapsulation layer.

In one embodiment of the present specification, the organic light emitting device consecutively comprises glass, a plastic substrate, a thin film transistor, an organic light emitting diode and an encapsulation layer.

FIG. 2 illustrates a state in which the surface protective film (40) having a base film 10 and adhesive film 20, according to one embodiment of the present disclosure, is attached to an encapsulation layer (515) during the process of manufacturing an organic light emitting electronic device. When referring to FIG. 2, the surface protective film of FIG. 1 according to one embodiment of the present disclosure is attached on an encapsulation layer (515) of an organic light emitting device (510) consecutively comprising glass (511), a plastic substrate (512), a thin film transistor (513), an organic light emitting diode (514) and an encapsulation layer (515) so that the adhesive film (20) and the encapsulation layer (515) face each other.

The encapsulation layer may exhibit excellent moisture barrier properties and optical properties in the organic light emitting electronic device. In addition, the encapsulation layer may be formed as a stable encapsulation layer regardless of a type of the organic light emitting electronic device such as top emission or bottom emission.

In one embodiment, the encapsulation layer may comprise a single-layered or multilayered inorganic material layer. As a method of forming the encapsulation layer, common methods of forming an encapsulation layer known in the art may be used.

Examples of the single-layered or multilayered inorganic material layer may comprise aluminum oxide-based, silicon nitride-based, silicon oxynitride-based and the like.

The method for manufacturing an organic light emitting electronic device of the present application may further comprise peeling the surface protective film from the encapsulation layer; and laminating a touch screen panel and a cover window on the encapsulation layer. The surface protective film has an excellent antistatic function for the encapsulation layer when peeled from the encapsulation layer, which prevents attachment of foreign substances between the encapsulation layer and the touch screen when bonding the touch screen panel on the encapsulation layer, and thereby prevents device defects.

Hereinafter, the present disclosure will be described in detail with reference to examples so that those having common knowledge in the art may readily implement the present disclosure.

However, the present disclosure may be embodied in various different forms, and is not limited to the examples described herein.

EXAMPLES

Preparation Example

Preparation of Surface Protective Film

Preparation Example 1—Preparation of Adhesive Composition

To a 5-neck 2 L reactor, 10 parts of difunctional ether polyol (adding 20% of EO to PPG, trade name SC2204 of KPX Chemical) and 90 parts of trifunctional ether polyol (trade name SC3314 of KPX Chemical) were introduced with respect to 100 parts by weight of polyurethane polymer, and H12MDI (manufactured by Evonik Industries), an isocyanate, was introduced thereto in an amount such that OH/NCO (functional group molar ratio) is 1.5, and then 40 parts by weight of toluene was introduced thereto. (Non-volatile content 71%)

The temperature was raised from room temperature (25° C.) to 80° C., and, while maintaining the temperature, disappearance of the residual isocyanate group was identified by an IR spectrum, and the reaction was terminated and the resin was discharged.

Preparation Example 2—Preparation of Adhesive Composition

Preparation was made in the same manner as in Preparation Example 1 except that 20 parts of difunctional ether polyol (PPG) and 80 parts of trifunctional ether polyol (PPG) were introduced. (Non-volatile content 71%)

Preparation Example 3—Preparation of Adhesive Composition

Preparation was made in the same manner as in Preparation Example 1 except that 20 parts of difunctional ether polyol (PPG+EO) and 80 parts of trifunctional ether polyol (PPG) were introduced. (Non-volatile content 71%)

Preparation Example 4—Preparation of Adhesive Composition

Preparation was made in the same manner as in Preparation Example 3 except that the amount of H12MDI, an isocyanate, was changed such that OH/NCO is 1.45. (Non-volatile content 71%)

Preparation Example 5—Preparation of Adhesive Composition

Preparation was made in the same manner as in Preparation Example 1 except that 20 parts of difunctional ether polyol (PPG) and 80 parts of trifunctional ether polyol (PPG+EO) were introduced. (non-volatile content 71%)

Preparation Example 6—Preparation of Adhesive Composition

Preparation was made in the same manner as in Preparation Example 1 except that 30 parts of difunctional ether polyol (PPG) and 70 parts of trifunctional ether polyol (PPG+EO) were introduced. (non-volatile content 71%)

Preparation Example 7—Preparation of Adhesive Composition

Preparation was made in the same manner as in Preparation Example 1 except that 20 parts of difunctional ether polyol (PPG+EO) and 80 parts of trifunctional ether polyol (PPG) were introduced, and the amount of H12MDI, an isocyanate, was changed such that OH/NCO is 1.6. (non-volatile content 71%)

Preparation Example 8—Preparation of Adhesive Composition

Preparation was made in the same manner as in Preparation Example 7 except that the amount of H12MDI, an isocyanate, was changed such that OH/NCO is 1.65. (Non-volatile content 71%)

Comparative Preparation Example 1—Preparation of Adhesive Composition

Preparation was made in the same manner as in Preparation Example 1 except that 70 parts of difunctional ether polyol (PPG) and 30 parts of trifunctional ether polyol (PPG) were introduced, and OH/NCO was adjusted to 1.2. (Non-volatile content 71%)

Comparative Preparation Example 2—Preparation of Adhesive Composition

Preparation was made in the same manner as in Comparative Preparation Example 1 except that 80 parts of difunctional ether polyol (PPG) and 20 parts of trifunctional ether polyol (PPG) were introduced. (Non-volatile content 71%)

Comparative Preparation Example 3—Preparation of Adhesive Composition

Preparation was made in the same manner as in Comparative Preparation Example 1 except that 90 parts of difunctional ether polyol (PPG) and 10 parts of trifunctional ether polyol (PPG) were introduced. (Non-volatile content 71%)

Comparative Preparation Example 4—Preparation of Adhesive Composition

Preparation was made in the same manner as in Preparation Example 1 except that 20 parts of difunctional ester polyol and 80 parts of trifunctional ether polyol (PPG) were introduced. (Non-volatile content 71%)

Comparative Preparation Example 5—Preparation of Adhesive Composition

Preparation was made in the same manner as in Preparation Example 1 except that 100 parts of difunctional ether polyol (PPG+EO) was introduced, and OH/NCO was adjusted to 1.1. (Non-volatile content 71%)

Comparative Preparation Example 6—Preparation of Adhesive Composition

Preparation was made in the same manner as in Preparation Example 1 except that 100 parts of difunctional ether polyol (PPG+EO) was introduced. (Non-volatile content 71%)

Comparative Preparation Example 7—Preparation of Adhesive Composition

Preparation was made in the same manner as in Comparative Preparation Example 5 except that OH/NCO was adjusted to 1.3. (Non-volatile content 71%)

Comparative Preparation Example 8—Preparation of Adhesive Composition

Preparation was made in the same manner as in Preparation Example 3 except that OH/NCO was adjusted to 1.2. (Non-volatile content 71%)

Comparative Preparation Example 9—Preparation of Adhesive Composition

Preparation was made in the same manner as in Preparation Example 1 except that toluene was introduced in 100 parts by weight. (Non-volatile content 50%)

With respect to 100 parts by weight (based on solid content) of each of Preparation Examples 1 to 8 and Comparative Preparation Examples 1 to 9, 15 parts by weight of a multifunctional isocyanate curing agent was introduced, and the result was sufficiently stirred, coated on a polyester (PET) film, and dried for 3 minutes in a 140° C. oven to prepare a polyurethane adhesive layer having a thickness of 75 μm. After that, the result was aged for 120 hours in a 50° C. oven.

In preparing the adhesive layer as above, coating was not conducted in Comparative Preparation Example 6 due to gelation in the resin preparation process, and the adhesive composition of each of Comparative Preparation Example 7 and Comparative Preparation Example 8 had viscosity outside the range of the composition itself, and coating was not conducted due to poor coatability.

OH/NCO functional group ratio, molecular weight, viscosity, polyol composition and content for Preparation Examples 1 to 8 and Comparative Preparation Examples 1 to 9 are as shown in the following Table 1.

TABLE 1

| | OH/NCO Ratio | Molecular Weight (Mn) | Viscosity (cPs) | Polyol (Difunctional/ Trifunctional) | Polyol Ratio (Difunctional/ Trifunctional) |
|---|---|---|---|---|---|
| Preparation Example 1 | 1.5 | 100,000 | 4,200 | PPG/PPG | 10/90 |
| Preparation Example 2 | 1.5 | 85,000 | 3,500 | PPG/PPG | 20/80 |
| Preparation Example 3 | 1.5 | 95,000 | 3,800 | PPG + EO/PPG | 20/80 |
| Preparation Example 4 | 1.4 | 110,000 | 4,500 | PPG + EO/PPG | 20/80 |
| Preparation Example 5 | 1.5 | 123,000 | 4900 | PPG/PPG + EO | 20/80 |
| Preparation Example 6 | 1.5 | 105,000 | 4100 | PPG/PPG + EO | 30/70 |
| Preparation Example 7 | 1.6 | 100,000 | 3900 | PPG + EO/PPG + EO | 20/80 |
| Preparation Example 8 | 1.65 | 87,000 | 3200 | PPG + EO/PPG + EO | 20/80 |
| Comparative Preparation Example 1 | 1.2 | 110,000 | 5400 | PPG/PPG | 70/30 |
| Comparative Preparation Example 2 | 1.2 | 95,000 | 5000 | PPG/PPG | 80/20 |
| Comparative Preparation Example 3 | 1.5 | 65,000 | 5500 | PPG/PPG | 90/10 |
| Comparative Preparation Example 4 | 1.5 | 117,000 | 4900 | Ester/PPG | 20/80 |
| Comparative Preparation Example 5 | 1.1 | 43,000 | 1900 | PPG + EO | 100/0 |
| Comparative Preparation Example 6 | 1.5 | — | — | PPG | 0/100 |
| Comparative Preparation Example 7 | 1.3 | 32,000 | 750 | PPG + EO | 100/0 |
| Comparative Preparation Example 8 | 1.2 | 210,000 | 13,500 | PPG + EO/PPG | 20/80 |
| Comparative Preparation Example 9 | 1.5 | 60,000 | 800 | PPG/PPG | 10/90 |

Low-rate and high-rate peel strength of the adhesive layers according to Preparation Examples 1 to 8 and Comparative Preparation Examples 1 to 9 are as shown in the itself, and coating was not conducted due to poor coatability, and as a result, high-rate peel strength and low-rate peel strength themselves were not able to be measured.

TABLE 2

| | Low-Rate Peel Strength (1.8 m/min) | High-Rate Peel Strength (20 m/min) |
|---|---|---|
| Example 1 (Preparation Example 1) | 17.7 | 34.2 |
| Example 2 (Preparation Example 2) | 23.2 | 42.9 |
| Example 3 (Preparation Example 3) | 15.9 | 31.0 |
| Example 4 (Preparation Example 4) | 19.3 | 37.2 |
| Example 5 (Preparation Example 5) | 16.1 | 33.6 |
| Example 6 (Preparation Example 6) | 21.1 | 38.4 |
| Example 7 (Preparation Example 7) | 13.7 | 28.1 |
| Example 8 (Preparation Example 8) | 16.5 | 32.4 |
| Comparative Example 1 (Comparative Preparation Example 1) | 73.9 | 130.5 |
| Comparative Example 2 (Comparative Preparation Example 2) | 73.9 | 130.5 |
| Comparative Example 3 (Comparative Preparation Example 3) | 89.1 | 153.6 |
| Comparative Example 4 (Comparative Preparation Example 4) | 35.1 | 70.8 |
| Comparative Example 5 (Comparative Preparation Example 5) | 110.3 | 183.7 |
| Comparative Example 6 (Comparative Preparation Example 6) | Coating not Conducted Due to Gelation | Coating not Conducted Due to Gelation |
| Comparative Example 7 (Comparative Preparation Example 7) | Unable to Coat | Unable to Coat |
| Comparative Example 8 (Comparative Preparation Example 8) | Unable to Coat | Unable to Coat |
| Comparative Example 9 (Comparative Preparation Example 9) | Unable to Coat | Unable to Coat | following Table 2. In addition, coating was not conducted in Comparative Preparation Example 6 due to gelation in the resin preparation process, and the adhesive compositions of Comparative Preparation Example 7, Comparative Preparation Example 8 and Comparative Preparation Example 9 each had viscosity outside the range of the composition As seen from Table 1 and Table 2, it was seen that, in the polyurethane-based adhesive compositions of Examples 1 to 8, the content portion of the difunctional polyol and the trifunctional polyol satisfies a specific range, and urethane crosslinking density was effectively controlled by controlling the hydroxyl group of the urethane polyol.

In addition, it was identified that, by the adhesive composition viscosity satisfying a specific range, excellent coatability with a small thickness variation for the base was obtained during adhesion coating, and particularly, it was identified that the adhesive compositions of Comparative Preparation Example 7 to Comparative Preparation Example 9 had viscosity outside the range, and coating was not conducted due to poor coatability.

With the polyurethane-based adhesive composition of each of Examples 1 to 8, it was identified that adherend damage was minimized when attaching to the adherend and re-peeling by reducing re-peelability at a high rate.

The invention claimed is:

1. A surface protective film comprising:
a base film; and
an adhesive film comprising polyurethane-based adhesive composition, or a cured material thereof, provided on one surface of the base film,
wherein the polyurethane-based adhesive composition comprising:
a polyurethane polymer comprising a difunctional polyol and a trifunctional polyol; and
an isocyanate-based crosslinking agent,
wherein the adhesive composition has viscosity of greater than or equal to 1,000 cPs and less than or equal to 10,000 cPs under a condition of 25° C. and relative humidity of 60%;
the difunctional polyol is included in an amount of 5 parts by weight to 40 parts by weight, based on 100 parts by weight of the polyurethane polymer; and
the trifunctional polyol is included in an amount of 60 parts by weight to 95 parts by weight, based on 100 parts by weight of the polyurethane polymer and,
wherein the base film has a thickness of greater than or equal to 25 μm and less than or equal to 150 μm,
wherein the adhesive film has a thickness of greater than or equal to 10 μm and less than or equal to 100 μm,
wherein low-rate peel strength is 5 gf/inch or greater when bonding one surface of the adhesive film to a glass substrate and then peeling at a peeling angle of 1800 and a rate of 1.8 m/min, and high-rate peel strength is 50 gf/inch or less when bonding one surface of the adhesive film to a glass substrate and peeling at a peeling angle of 180° and a rate of 20 m/min; and wherein a hydroxyl group of the polyurethane polymer and an isocyanate functional group have a molar ratio (—OH/NCO) of greater than or equal to 1.3 and less than or equal to 1.7.

2. The surface protective film of claim 1, further comprising a release sheet on a surface of the adhesive film opposite to the surface in contact with the base film.

3. The surface protective film of claim 1, wherein the base film is selected from the group consisting of PET (polyethylene terephthalate), PC (polycarbonate), PI (polyimide), PEN (polyethylene naphthalate), PEEK (polyether ether ketone), PAR (polyarylate), PCO (polycyclic olefin), polynorbornene, PES (polyethersulphone) and COP (cycloolefin polymer).

4. A method for preparing a surface protective film, the method comprising:
preparing the polyurethane-based adhesive composition of claim 1;
adding a curing agent to the polyurethane-based adhesive composition; and
coating the polyurethane-based adhesive composition on a base film.

5. The method for preparing a surface protective film of claim 4, further comprising:
after coating of the polyurethane-based adhesive composition on a base film drying the polyurethane-based adhesive composition; and thermally curing the polyurethane-based adhesive composition.

6. A method for manufacturing an organic light emitting electronic device, the method comprising:
attaching a surface protective film of claim 1 on an encapsulation layer of an organic light emitting device.

7. The method for manufacturing an organic light emitting electronic device of claim 6, wherein the organic light emitting device consecutively comprises glass, a plastic substrate, a thin film transistor, an organic light emitting diode and an encapsulation layer.

8. The method for manufacturing an organic light emitting electronic device of claim 6, further comprising:
peeling the surface protective film from the encapsulation layer; and
laminating a touch screen panel and a cover window on the encapsulation layer.

* * * * *